United States Patent
Briceno et al.

(10) Patent No.: US 9,035,170 B2
(45) Date of Patent: May 19, 2015

(54) LIGHT POWER GENERATION DEVICE

(75) Inventors: Jose Briceno, Ohta-ku (JP); Satoru Yamazaki, Handa (JP)

(73) Assignee: Nusola, Inc., Scottsdale, AZ (US)

( * ) Notice: Subject to any disclaimer, the term of this patent is extended or adjusted under 35 U.S.C. 154(b) by 142 days.

(21) Appl. No.: 13/637,536

(22) PCT Filed: Jun. 1, 2011

(86) PCT No.: PCT/JP2011/062606
§ 371 (c)(1),
(2), (4) Date: Sep. 26, 2012

(87) PCT Pub. No.: WO2011/155373
PCT Pub. Date: Dec. 15, 2011

(65) Prior Publication Data
US 2013/0019941 A1    Jan. 24, 2013

(30) Foreign Application Priority Data
Oct. 6, 2010 (JP) ................................. 2010-133301

(51) Int. Cl.
*H01L 31/07* (2012.01)
*H01L 31/0224* (2006.01)
(Continued)

(52) U.S. Cl.
CPC ........ *H01L 31/07* (2013.01); *H01L 31/022425* (2013.01); *H01L 31/0236* (2013.01); *Y02B 10/12* (2013.01); *Y02E 10/52* (2013.01); *H02S 20/23* (2014.12)

(58) Field of Classification Search
USPC ........... 136/255; 257/453, E31.037, E31.065; 438/92
See application file for complete search history.

(56) References Cited

U.S. PATENT DOCUMENTS

| 6,300,558 | B1 * | 10/2001 | Takamoto et al. | 136/262 |
| 2010/0175745 | A1 * | 7/2010 | Kostecki et al. | 136/255 |
| 2012/0180853 | A1 * | 7/2012 | Briceno | 136/252 |

FOREIGN PATENT DOCUMENTS

| DE | 4427881 A1 | 2/1996 |
| JP | 2010021189 A | 1/2010 |

(Continued)

OTHER PUBLICATIONS

Kobayashi et al., Quantum Theoretical Approach to OPtical Near-Fields and Some Related Applications, Progress in Nano-Electro OPtics I, Springer, pp. 119-157 (2003).*

(Continued)

*Primary Examiner* — Jayne Mershon
(74) *Attorney, Agent, or Firm* — Robert D. Becker; Manatt, Phelps & Phillips LLP

(57) ABSTRACT

[Problem] To provide a photovoltaic device capable of generating power whether day or night, without affecting the appearance of a structure or reducing lighting or other functions, and able to inhibit rises in room temperature by converting thermal radiation into electrical energy.

[Means to Solve Problems] Provide a photoelectric conversion element 3 with a photovoltaic device 1 on structural members 2a-2d facing the outside of a house or other structure. Power generated by the photoelectric conversion element 3 is extracted via a power extraction unit 4. The power conversion element 3 includes a semiconductor layer 11, conductive layer 20, a metal nanostructure 30 having multiple periodic structures 33, a first electrode 41 and a second electrode 42. The first and second electrodes 41, 42 are separated in the direction of the surface of the photoelectric conversion element 1 with the terminals 71, 81 of the power extraction unit 4 respectively connected.

9 Claims, 7 Drawing Sheets

(51) Int. Cl.
*H01L 31/0236* (2006.01)
*H02S 20/23* (2014.01)

(56) References Cited

FOREIGN PATENT DOCUMENTS

WO  2011012516 A2  1/2008
WO  2008150295 A2  12/2008
WO  2011018829 A1  2/2011

OTHER PUBLICATIONS

Losurdo, et al., "Enhanced Absorption in AU Nanoparticles/a-Si:H/c-Si Heterojunction Solar Cells Exploiting AU Surface Plasmon Resonance," Solare ENergy Materials and Solar Cells, Elsevier Science Publishers, Amsterdam, NL, vol. 93, No. 10, Oct. 1, 2009.

* cited by examiner

LIGHT POWER GENERATION DEVICE

CROSS REFERENCE TO RELATED APPLICATION

The present application claims priority to Japanese Application No. 2010-133301 filed Jun. 10, 2010, which is incorporated herein by reference in its entirety for all purposes.

TECHNICAL FIELD

The invention concerns a device for generating power using sunlight or other light, specifically a photovoltaic device ideal for incorporating into the roof, outer walls, windows, doors, approach (the passage from the entrance to the gangway) or gateposts.

PRIOR ART

Solar cells are well-known devices for generating power with sunlight. In general, solar cells include a silicon element having a PN contact, with electrodes provided on its front and back surfaces. Solar cells are formed into panels, which are then installed onto the roofs and other parts of buildings (See Patent Literature 1).

CITATION LIST

Patent Literature

Patent Literature 1: Unexamined Japanese Patent Application Publication H08-274365

SUMMARY OF THE INVENTION

Problems to be Solved

Conventional solar cells are mostly capable of generating power only during the daytime when sunlight is being radiated, and have mostly been incapable of generating power during the night. In addition, the installation of solar cells in outer walls or windows affects the appearance of a building, and reduces their lighting function, therefore it has not been easy to install solar cells in locations other than the roof.

Means to Solve Problems

In order to solve the aforementioned problems, the invention is a device for generating power by absorbing light, characterized by being equipped with a photoelectric conversion element provided in structural members facing outdoors, and a power extraction unit for extracting power generated by the aforementioned photoelectric conversion element, wherein the aforementioned photoelectric conversion element consists of a semiconductor layer, a conductive layer laminated over the aforementioned semiconductor layer, a metal nanostructure having a plurality (preferably several) of periodic structures laminated over the aforementioned conductive layer or aforementioned semiconductor layer, and a plurality of first projections including a pair of first and second electrodes wherein the aforementioned periodic structures are projecting in the direction of the aforementioned lamination, wherein the placement of the aforementioned first projections differ according to the aforementioned periodic structures, the aforementioned first and second electrodes are provided mutually separated in a direction along the surface of the aforementioned photoelectric conversion element, and the aforementioned power extraction unit includes a pair of terminals respectively connected to the aforementioned first and second electrode.

When light enters the aforementioned photoelectric conversion element, photocarriers are generated by the photoelectric conversion at the Schottky junction of the semiconductor layer and conductive layer. Additionally, the sensitivity of the photoelectric conversion may be raised by a metal nanostructure in the vicinity of the aforementioned Schottky junction. Furthermore, the wavelength region of photoelectrically convertible incidence light may be widened with a metal nanostructure.

The power generated by the aforementioned photoelectric conversion element may be extracted via a power extraction unit.

The aforementioned photovoltaic device may be used for the photoelectric conversion of sunlight of a wide band region into power. It is naturally capable of yielding sufficiently large amounts of power during clear skies, but may also do so when skies are cloudy. Furthermore, it is also capable of yielding power after sunset by photoelectrically converting infrared light radiated from surrounding structures. Consequently, it is capable of generating power whether day or night.

It is capable of preventing thermoconversion of infrared light by absorbing infrared light, can reduce the energy entering indoors, and inhibit indoor rises in temperature. In particular, it is capable of generating power while providing a thermal barrier during light collection when the aforementioned photoelectric conversion element has been disposed on window glass.

The aforementioned photoelectric conversion element may be very thin and semitransparent. Consequently, it hardly affects the appearance of structures onto which it is installed, making it possible to largely maintain the same design as when the aforementioned photoelectric conversion element is not installed. Even if the aforementioned photoelectric conversion element is installed on window glass, it is possible to avoid losing lighting. A first and second electrode may be disposed in the corners or periphery of the aforementioned photoelectric conversion element. Consequently, even if the aforementioned photoelectric conversion element is installed on window glass, it will be possible to adequately maintain the transparency of the window glass. Furthermore, there will be no need to provide wiring to the window glass.

The metal component comprising the aforementioned conductive layer may be Co, Fe, W, Ni, Al or Ti. This list of metal elements is relatively high in melting point and is superior in mechanical properties at high temperatures. The aforementioned conductive layer may be of metal, but may also be a mixture or allow of metal and semiconductor. A metal silicide is an example of a metal and semiconductor mixture or alloy. If the aforementioned semiconductor layer consists of silicon, then the aforementioned conductive layer may be a metal silicide with a mutual diffusion of the aforementioned metal components and the surface component of the aforementioned semiconductor layer. The aforementioned diffusion may be performed by annealing. The aforementioned list of metals (Co, Fe, W, Ni, Al, Ti) is suitable for silicidation.

The aforementioned metal nanostructure is preferable disposed in the proximity of the Schottky junction of the semiconductor layer and conductive layer. The aforementioned metal nanostructure is preferably laminated onto the conductive layer. If part of the semiconductor layer (Hereinafter, projecting layer, etc.) is not covered by the conductive layer, then the metal nanostructure may not be laminated on the aforementioned part of the aforementioned semiconductor layer.

The aforementioned metal nanostructure is preferably provided in a section between the aforementioned pair of electrodes on the aforementioned conductive layer, and ideally widely distributed across a section between the aforementioned pair of electrodes.

When light enters the aforementioned metal nanostructure, plasmon resonance may occur. This may result in the metal nanostructure contributing to the enlargement of the photoinduced electric field.

The aforementioned metal nanostructure is preferably an aggregate of nano-sized metal microparticles.

The metals used to comprise the aforementioned metal nanostructure are preferably Au, Ag, Pt, Cu or Pd. This list of metal elements is relatively high in chemical stability, unlikely to form an alloy, and unlikely to chemically combine with semiconductors of Si or otherwise. Hence, they will definitely form a surface plasmon.

An M-I-M structure may be formed with an insulator of a carbon compound or otherwise may be mixed into the aforementioned metal nanostructure.

At least one of the aforementioned periodic structures preferably has a placement approximately 0.1 to 1 times the size (particularly those about 0.1 times the size) of a given wavelength within a given wavelength range (preferably the visible light to infrared region). As a result, if incident light falls within the aforementioned wavelength range, then at least one periodic structure of the metal nanostructure may have sensitivity to the incident light. The entirety of the sensitivity range of the aforementioned photoelectric conversion element may comprise the entirety of the aforementioned wavelength range.

The aforementioned metal nanostructure may be formed as follows, as an example. Metal raw material that will serve as the aforementioned metal nanostructure is disposed on top of the aforementioned conductive layer and annealed. The annealing temperature conditions may be about 400° C. to 800° C., preferably about 600° C. The form and characteristics of the aforementioned metal raw material are not specified, but it may be a thin film, small pieces, a small mass, granular, a powder, colloidal, fibers, wife, or dots, otherwise any other form or characteristics are acceptable. The aforementioned annealing allows microparticles of the aforementioned metal raw material to be diffused along the surface of the aforementioned conductive layer. The microparticles of the aforementioned metal raw material are branched out into multiple levels or layers, form an aggregate with a fractal structure, for example. Thus, it is possible to easily form the aforementioned metal nanostructure. Submicron or nano-order irregularities are formed on the surface of the aforementioned metal nanostructure. The surface of the aforementioned metal nanostructure includes a plurality of projections projecting in the direction of lamination (thickness-wise direction) in a cluster shape, for example.

The aforementioned electrodes may also be used as the metal raw material for the aforementioned metal nanostructure. The metal comprising the aforementioned electrodes may be diffused so that they form a cluster or fractal shape in the periphery of the aforementioned electrodes. By doing so, the aforementioned metal nanostructure may be formed in the proximity of the aforementioned electrodes. In which case, the aforementioned electrodes and aforementioned metal nanostructure mutually incorporate the same metal components.

The aforementioned periodic structures in the aforementioned metal nanostructure preferably have random periods. The periods of the aforementioned periodic structures are preferably changing. Namely, the placement of the aforementioned first projections preferably differs according to the periodic structure. Thus, sensitivity to light of different wavelengths depending on the periodic structure is possible. Consequently, it is possible for the metal nanostructure to widen the overall sensitive wavelength region. Thus, this ensures that the aforementioned photoelectric conversion element is definitely capable of handling a wide band range from visible light to infrared.

The placement (period) of the first projections preferably is approximately 0.1 to 1 times the wavelength $\lambda$ of incident light, ideally about 0.1 times the wavelength $\lambda$. Otherwise, the placement (period) of the first projections preferably is approximately 0.1 to 1 times the sensitive wavelength of the Schottky element made by the semiconductor layer and conductive layer. The aforementioned periodic structures are sensitively attuned to incident light having a wavelength $\lambda$ approximately 1 to 10 times the period of the first projections comprising said periodic structures (particularly those about 10 times the aforementioned period) to cause plasmon resonance, and contribute to amplification of the photoinduced electric field. The placement of periodic structures (placement of first projections) wherein the semiconductor layer is an n-type element is preferably smaller than the placement of periodic structures (placement of first projections) wherein the semiconductor layer is an n-type element. With elements wherein the semiconductor layer is an n-type element, the placement (period) of first projections ideally is approximately 100 nm or less. Thus, it is possible to achieve a favorable sensitivity to light in the infrared to visible light region with a wavelength of approximately 1 μm or less. With elements wherein the semiconductor layer is a p-type element, the placement (period) of first projections ideally is approximately 150 nm or less. Thus, it is possible to achieve a favorable sensitivity to infrared light with a wavelength of approximately 1 μm to 4 μm.

The projection height of the first projections preferably is approximately 10 nm to 20 nm.

Preferably, the aforementioned metal nanostructure further includes a plurality of second projections projecting higher than the aforementioned first projections, wherein these second projections are mutually dispersed, and each of these second projections are disposed overlapping or adjacent to any one of the aforementioned periodic structures.

When light enters the aforementioned metal nanostructure, near field light is generated in the periphery of the aforementioned second projections. It is therefore possible to amplify the photoinduced electric field with good sensitivity through the synergistic effect of this near field light and the plasmon resonance of the aforementioned periodic structures (See K. Kobayashi, et al, Progress in Nano-Electro-Optics I, ed. M. Ohtsu, p. 119 (Springer-Verlag, Berlin, 2003)). Even if the incident light is faint, it is possible to generate photovoltaic power at high sensitivity.

The projection height of the aforementioned second projections preferably is approximately 50 nm to 200 nm.

The dispersion of the aforementioned second projections (spacing of adjoining second projections) is preferably larger than the wavelength of incident light, and larger than the sensitive wavelength of the Schottky element made by the semiconductor layer and conductive layer.

The dispersion of the second projections of an element wherein the semiconductor layer is n-type is preferably smaller than the dispersion of second projections of an element wherein the semiconductor layer is p-type. For example, if the semiconductor layer is n-type, then the dispersion of the aforementioned second projections preferably is 1 μm or more, ideally approximately 2 μm to 3 μm. If the semiconductor layer is p-type, then the dispersion of the aforementioned second projections preferably is approximately 3 μm to 5 μm. Thus, it is possible to avoid weakening of the electric field from interference by adjoining second projections.

The upper limit of the dispersion of the aforementioned second projections preferably is about 3 μm to 5 μm, and if p-type, ideally about 5 μm to 6 μm. Thus, it is possible to ensure the placement density of the second projections, achieve a number of periodic structures capable of producing an interaction with the second projections, and widen the sensitive band region.

Preferably, a polarity adjustment layer is further provided between the aforementioned first electrode and the aforementioned semiconductor layer to adjust the aforementioned first and second electrodes.

If the aforementioned semiconductor layer is an n-type semiconductor, then photocarrier electrons move towards the semiconductor layer as a result of a depletion layer electric field. As a result, electrons flow from the aforementioned second electrode to the conductive layer. The electrons (current) between the second electrode and conductive layer are able to flow smoothly. Electrons gather in the periphery of the first electrode of the semiconductor layer. Consequently, the aforementioned first electrode acts as a cathode. The aforementioned second electrode acts as an anode.

If the aforementioned semiconductor layer is a p-type semiconductor, photocarrier positive holes move to the semiconductor layer as a result of the depletion layer electric field. As a result, positive holes flow from the aforementioned second electrode to the conductive layer. Positive holes flow to the aforementioned first electrode along the conductive layer. Consequently, the aforementioned first electrode acts as an anode. The aforementioned second electrode acts as a cathode.

Thus, it is possible to fully designate an anode electrode and a cathode electrode, and control the direction of photo-induced current.

The aforementioned polarity adjustment layer preferably is comprised by an insulator with a thickness less than 1 nm.

Thus, the aforementioned conductive layer and aforementioned first electrode comprise a capacitor with an interposing barrier layer. Consequently, carriers accumulate in an area opposing the aforementioned first electrode in the conductive layer. If the aforementioned semiconductor layer is an n-type semiconductor, the electrons will accumulate. If the aforementioned semiconductor layer is a p-type semiconductor, positive holes will accumulate. Thus, it is possible to fully designate an anode electrode and a cathode electrode. As a result of the thickness of the aforementioned insulator being less than 1 nm, the carriers can fully pass through the barrier layer as a result of a tunnel effect, and photoinduced current may be fully extracted. Furthermore, as a result of carriers accumulating in an area opposing the aforementioned first electrode on the aforementioned conductive layer, voltage endurance is raised, and current-voltage properties during light incidence shift to the forward bias (front side). Consequently, it is possible to enlarge the power generated by the aforementioned photoelectric conversion element.

The aforementioned polarity adjustment layer is a projecting layer provided projecting on the surface of the aforementioned semiconductor layer, wherein the aforementioned conductive layer touches one side of the aforementioned projecting layer, the aforementioned first electrode is provided on the aforementioned surface opposing the aforementioned conductive layer and interposing the aforementioned projecting layer, and may touch the side surface of the aforementioned opposing side of the aforementioned projecting layer.

Thus, it is possible for the carriers to flow towards the first electrode in addition to the projecting layer at the Schottky junction of the projecting layer and conductive layer. Accordingly, it is possible to fully designate an anode electrode and a cathode electrode.

Furthermore, a nanostructure consisting of a semiconductor having sensitivity to ultraviolet or infrared regions may be provided on the surface of the aforementioned photoelectric conversion element. In particular, if the aforementioned semiconductor layer is an n-type semiconductor, then preferably a nanostructure consisting of a semiconductor having sensitivity to the ultraviolet region is provided on the surface of the aforementioned photoelectric conversion element. A semiconductor having sensitivity to the ultraviolet region refers to a semiconductor having the property of carriers becoming excited with incidence of ultraviolet light having a wavelength of 0.4 μm or less, for example. An example of this type of semiconductor is zinc oxide (ZnO), which is an n-type semiconductor; otherwise n-type gallium nitride (n-GaN) is available. If the aforementioned semiconductor layer is a p-type semiconductor, then preferably a nanostructure consisting of a semiconductor having sensitivity to the infrared region is provided on the surface of the aforementioned photoelectric conversion element. A semiconductor having sensitivity to the infrared region refers to a semiconductor having the property of carriers becoming excited with incidence of infrared light having a wavelength of 0.7 μm or more, for example. An example of this type of semiconductor is p-type gallium nitride (p-GaN) or carbon. The nanostructure may be a nanowire, nanotube, nanoneedle or nanorod, for example. As a result of the aforementioned nanostructure, it is possible to raise the sensitivity of photoelectric conversion. If the aforementioned nanostructure consists of a semiconductor having sensitivity to the ultraviolet region, it is possible to raise the photoelectric conversion sensitivity to incident light of the ultraviolet region. If the aforementioned nanostructure consists of a semiconductor having sensitivity to the infrared region, it is possible to raise the photoelectric conversion sensitivity to incident light of the infrared region. As a result the nanostructure being comprised by nanowire or nanotubes, it is possible to raise the quantum efficiency, and additionally fully raise the sensitivity of the aforementioned photoelectric conversion element.

The aforementioned photoelectric conversion element preferably is installed onto a structural member facing outdoors of a structure. If the aforementioned structural member is a movable member movably supported on a fixed part (a window or door, for example), the aforementioned power extraction unit preferably includes a fixed terminal provided on the aforementioned fixed part, and a movable terminal provided on the aforementioned movable member, in slidable contact with the aforementioned fixed terminal.

Thus, if the aforementioned photoelectric conversion element is installed on the movable member, regardless if the movable member is movable, it is possible to fully extract power generated by the aforementioned photoelectric conversion element via the movable terminal and fixed terminal.

The aforementioned photoelectric conversion element may directly coat the surface of the aforementioned structural member.

The aforementioned photoelectric conversion element may coat the surface of a base material, and this base material may be installed on the aforementioned structural member. The aforementioned base material preferably has heat-resistance to the aforementioned annealing.

Using a heat-resistant film as the aforementioned base material, the aforementioned photoelectric conversion element may be formed on the surface of said heat-resistant film, followed by processing said heat-resistant film to confer transparency or adhesion, and then attaching it to the aforementioned structural member.

A dissolvable temporary base material may be prepared by chemical or physical processes, and the aforementioned photoelectric conversion element formed on the surface of the aforementioned temporary base material, followed by dissolving the aforementioned temporary base material through the aforementioned chemical or physical processes to transcribe the aforementioned photoelectric conversion element to a film base material, and then attach this film base material to the aforementioned structural member. The aforementioned temporary base material preferably has heat resistance. The aforementioned chemical processes refer to chemically dissolving the aforementioned temporary base material with an acidic or alkali chemical agent, for example. The aforementioned physical processes refers to exposing the aforementioned temporary base material to an ultraviolet or electron beam, and then air blasting the aforementioned temporary base material to physically remove the aforementioned temporary base material, for example.

Effects of the Invention

The invention makes it possible to generate power whether day or night and increase the convenience of photovoltaic devices. As a result of converting thermal radiation into electrical energy, it is possible to inhibit rises in room temperature. Furthermore, it is possible to avoid affecting the appearance of structures and reducing lighting functions.

BRIEF DESCRIPTION OF DRAWINGS

FIG. 9 (b) is an image from observing a part of the surface of the metal nanostructure in the first working example different from that in FIG. 9 (a) with an SEM.

EMBODIMENTS OF THE INVENTION

Below, we will explain embodiments of the invention referring to drawings.

The photovoltaic device includes a photoelectric conversion element for converting light into electricity. The photoelectric conversion element is installed in a structure part of a designated space, such as specific premises, inside a building, or inside of a room. If the structure is fixed and provided within the aforementioned designated space, then it does not have to be a building, and may be a gatepost, wall or fence provided within the boundaries of the aforementioned designated space, or any fixture provided on the porch, approach, yard or grounds. A building may be a residence (house), for example. However, regardless, the building may also be a store, warehouse, garage, factory or other building. A residence may be a detached residential building or housing complex.

The photoelectric conversion device is installed on a structural member facing outside of the structure. Preferably, the photoelectric conversion device is installed in an area likely to be exposed to sunlight, such as the roof, rooftop or southern side. However, the installation location is not limited to these options.

The aforementioned structural member, regardless if it is an unfixed or fixed member, may be a movable member movably supported on a fixed part (window, door, shutters, etc.). The structural member may be a roof member, wall member, window glass, window frame member, door, shutters, floor member or laid member, for example. The roof member may be a tile, slate or metal sheet. A wall member may be an outer wall tile, siding, mortar or wallboard. A window frame member may be an aluminum sash. A floor member may be floor tile provided on a porch or terrace. Laid material may be laid tile provided on an approach or berm. The raw material of the aforementioned structural member is not specified as long as it can stably support the photoelectric conversion element, and may be metal, ceramic, glass, wood, plastic, stone, concrete or mortar.

Figure 1:
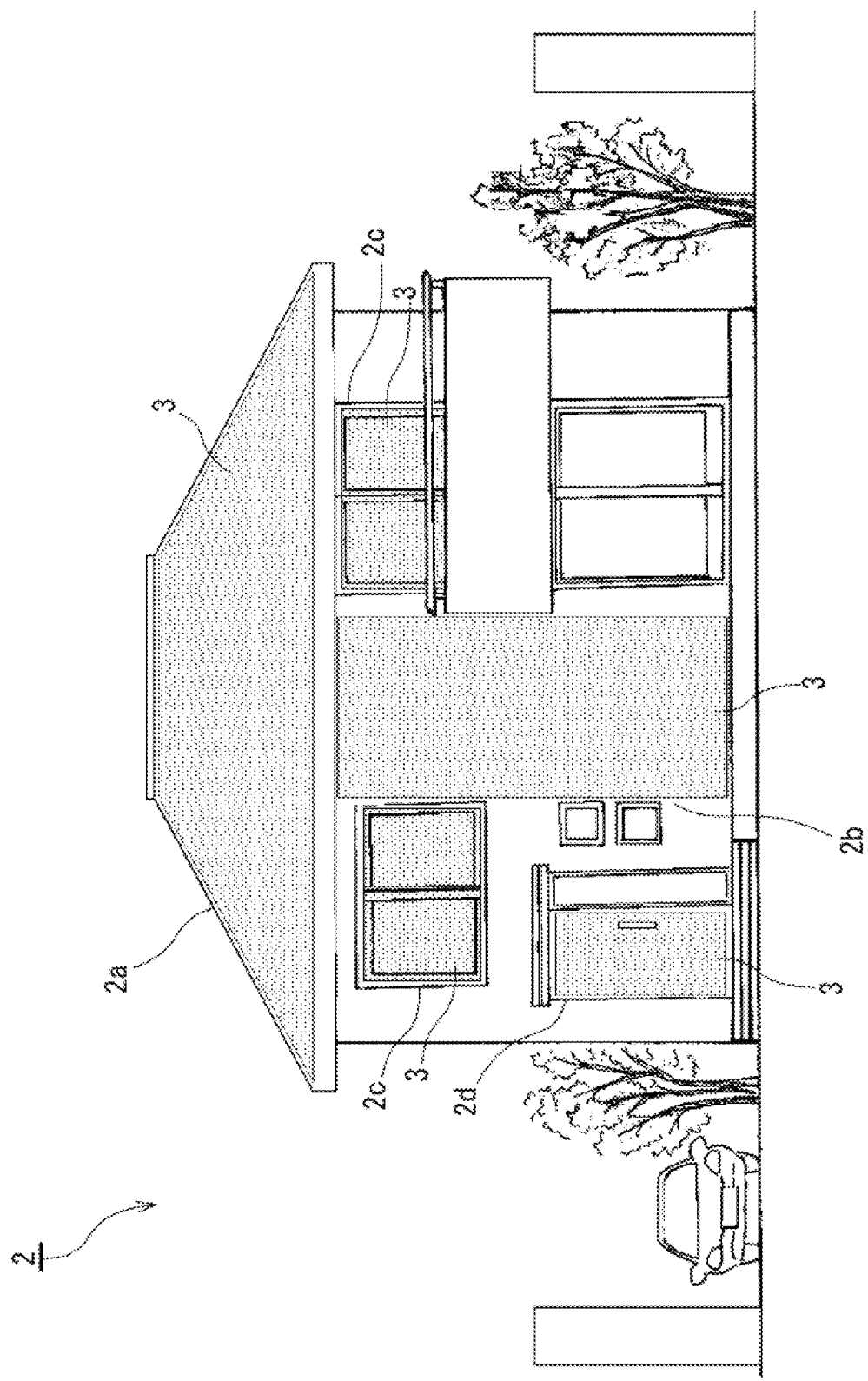
FIG. 1 shows an example of using a photovoltaic device related to a first embodiment of the invention; a front view of a house.
Figure 2:
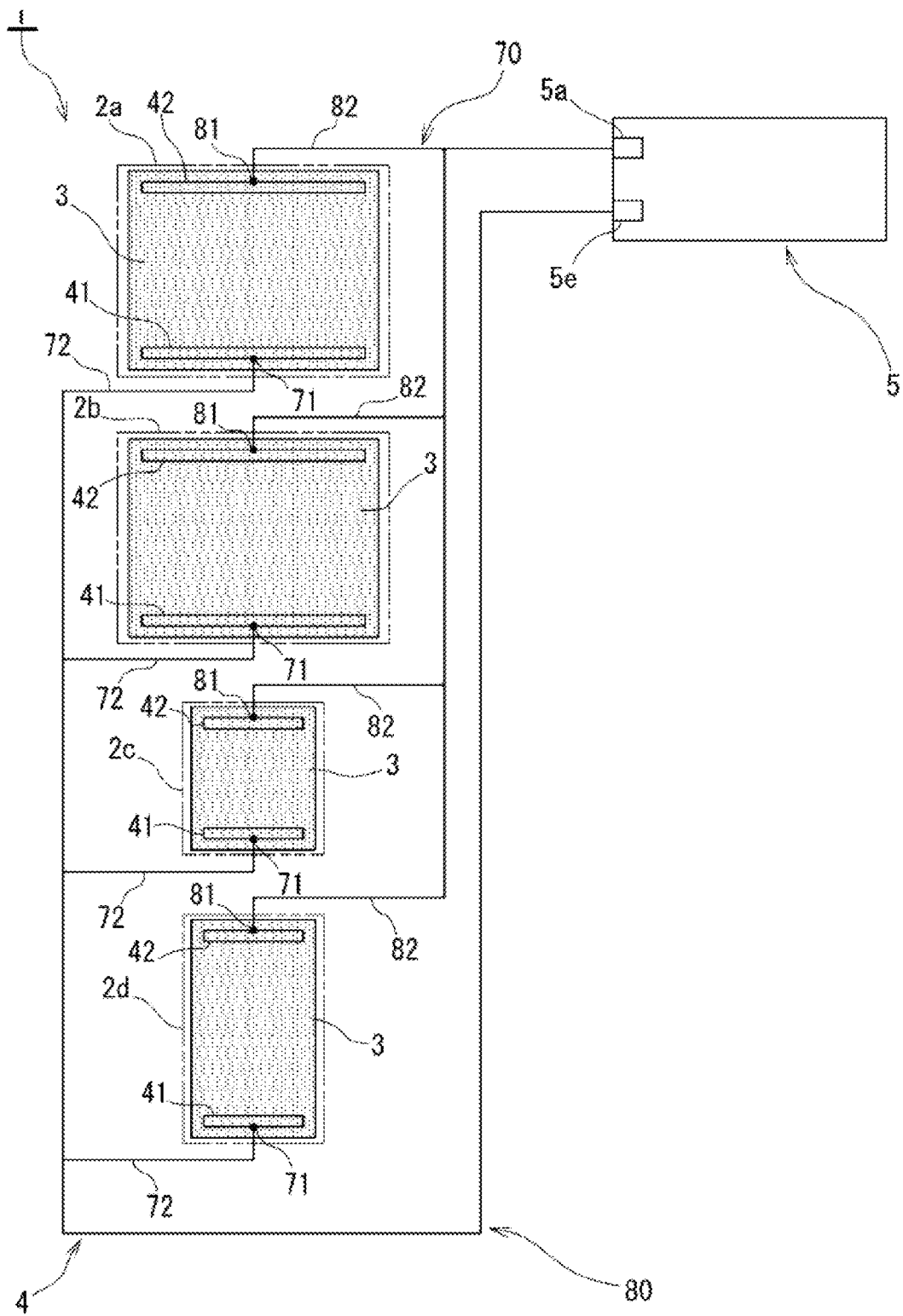
FIG. 2 A block diagram of the aforementioned photovoltaic device.

FIG. 1 and FIG. 2 show embodiments in which a photovoltaic device 1 is used in a house 2.

As shown in FIG. 2, the photovoltaic device 1 is equipped with a photoelectric conversion element 3, a power extraction unit 4 and a converter 5. The photoelectric conversion element 3 is connected to the converter 5 via the power extraction unit 4. When sunlight, infrared or other light enters the photoelectric conversion element 3, the photoelectric conversion element 3 converts the incident light into electrical energy. This electricity is delivered to the converter 5 by the power extraction unit 4, and AC-converted by the converter 5.

Figure 4:
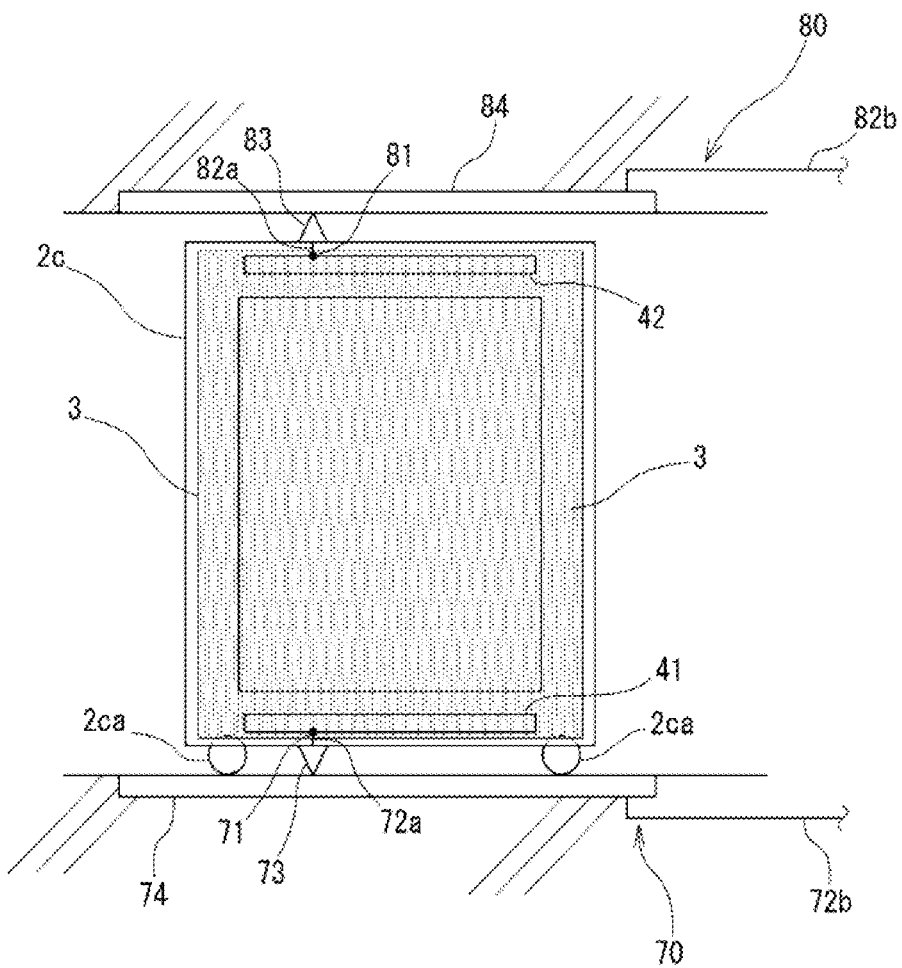
FIG. 4 is a front view descriptively showing the power extraction structure of the aforementioned photovoltaic device in the window of the aforementioned house.
Figure 5:
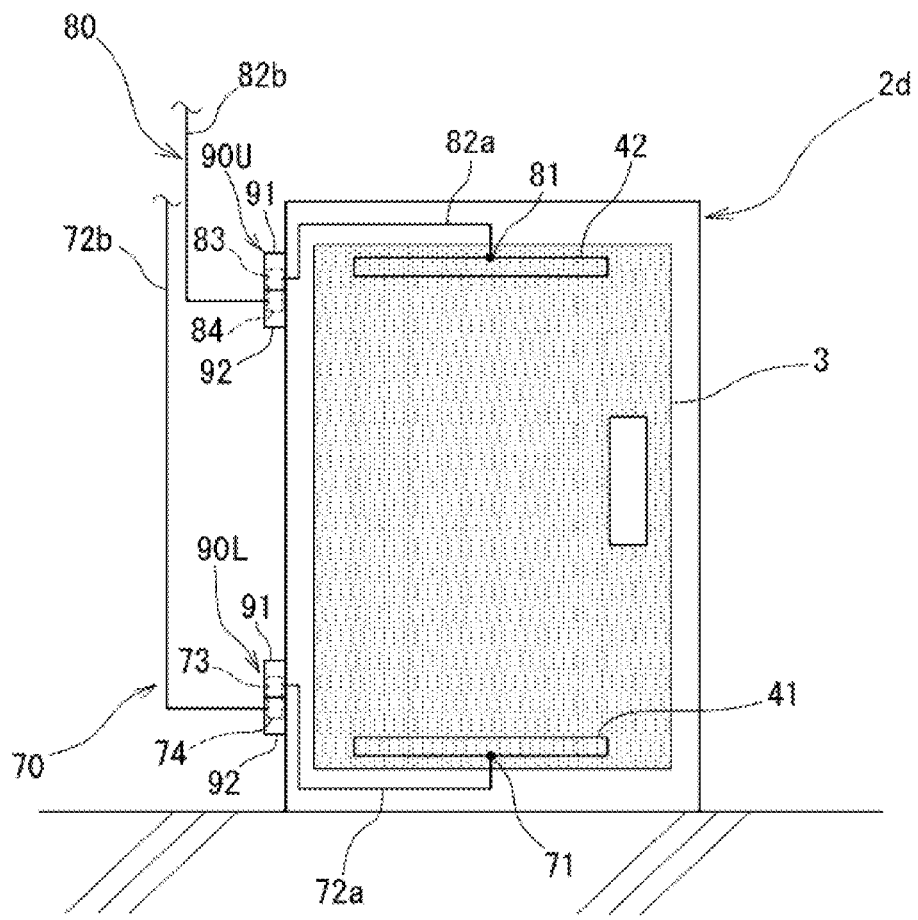
FIG. 5 is a front view descriptively showing the power extraction structure of the aforementioned photovoltaic device in the door of the aforementioned house.

FIG. 1 and FIG. 2 show the photoelectric conversion element 3 in halftone (same in FIG. 4 and FIG. 5). As shown in FIG. 1, the photoelectric conversion element 3 is provided on structural members of the house 2: a rooftop member 2a, an outer wall member 2b, a window member 2c and door 2d, for example. The window member 2c includes the window glass and window frame. Here, the photoelectric conversion element 3 is provided on the window glass and window frame.

Furthermore, the photoelectric conversion element 3 may be provided on only one of the two: either the window glass or the window frame. The window frame may be comprised of aluminum, for example. However, regardless, the window frame may also be of plastic or wood.

The photoelectric conversion element 3 may be provided over the entire surface of these structural members 2a-2d, or may be provided only on part of the outside surface. If a structural member facing the outside is subject to installation of the photoelectric conversion element 3, then it may be not only the aforementioned members 2a-2d, but the floor tile of the entranceway, the laid tile of the approach or the wall tile of the gateposts.

Figure 3:
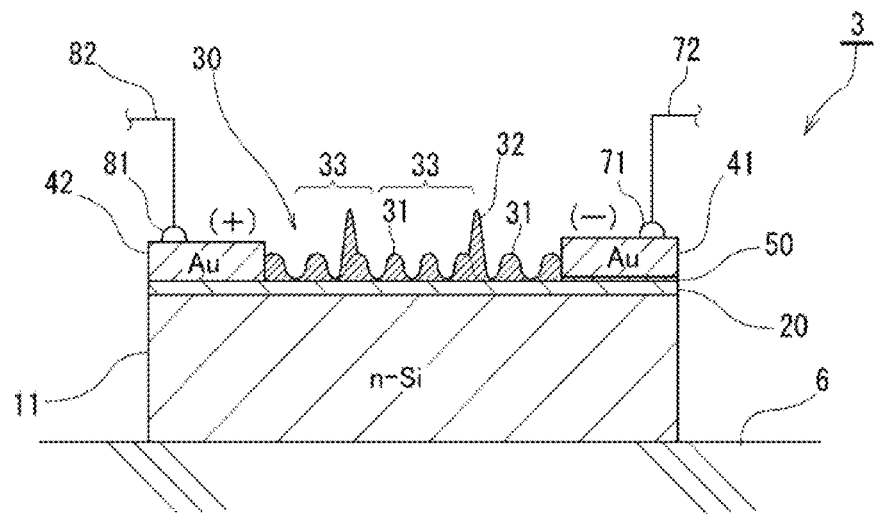
FIG. 3 is a cross section showing the structural outline of a photoelectric conversion element of the aforementioned photovoltaic device.

As shown in FIG. 3, the photoelectric conversion element 3 is installed on the surface of base material 6. Here, the base material 6 is comprised by structural members 2a-2d which are subject to installation. Namely, the photoelectric conversion element 3 is directly coating the surface of the structural members 2a-2d. Naturally a different member from the subjects for installation 2a-2d may be used as base material 6, coating this different member to form the photoelectric conversion element, and then installing this on the surface of installation subjects 2a-2d. The material of the base material 6 preferably has heat resistance that can tolerate the annealing temperatures described below.

As shown in FIG. 3, the photoelectric conversion element 3 is equipped with a semiconductor layer 11, conductive layer 20, metal nanostructure 30, and a pair of electrodes 41, 42. The semiconductor layer 11 is coated by the surface of the base material 6. The top of the semiconductor layer 11 is laminated with a conductive layer 20. The top of the conductive layer 20 is laminated by a metal nanostructure 30. Additionally, a pair of electrodes 41, 42 are provided on the conductive layer 20. A polarity adjustment layer 50 is interposed between the first electrode 41 and conductive layer 20.

As shown in FIG. 3, the semiconductor layer 11 is comprised by silicon (Si). However, regardless, the semiconductor layer 11 may be comprised by another semiconductor, such as Ge or GaAs. The semiconductor layer 11 is doped by n-type impurities such as P (phosphorus). The semiconductor layer 11 comprises an n-type semiconductor.

The conductive layer 20 covers the entirety of the surface of the semiconductor layer 11 (top of FIG. 3). The conductive layer 20 is comprised of metal silicide, and has conductivity. The silicon in the surface layer of the semiconductor layer 11 self-organizes, and comprises the silicon component of the conductive layer 12. The metal component comprising the conductive layer 20 may be Co, Fe, W, Ni, Al or Ti. However, the aforementioned metal component is not limited to these. Here, Co is being used as the metal component comprising the conductive layer 20. The conductive layer 20 is comprised of CoSix, preferably $CoSi_2$. Thus, a favorable Schottky boundary is formed between the conductive layer 20 and semiconductor layer 11. The conductive layer 20 may be comprised of only a metal component. The thickness of the conductive layer 20 is several nm to several tens of nm, preferably several nm.

The thickness of the conductive layer 20 in the drawings exceeds the thickness of the semiconductor layer 11, electrodes 41, 42 and metal nanostructure 30.

The metal nanostructure 30 is provided on the surface of the conductive layer 20 (top of FIG. 3). The metal nanostructure 30 is widely distributed about the surface of the conductive layer 20. Here, the metal nanostructure 30 is disposed on the surface of the conductive layer 20 in an area between the pair of electrodes 41, 42 (Hereinafter, "interelectrode space"), and ideally is distributed over the entirety of the aforementioned interelectrode space. The metal nanostructure 30 may laminated only part of the conductive layer 20. For example, the metal nanostructure 30 may be provided on only an area near the electrode 41 or 42 of the conductive layer 20.

The metal nanostructure 30 is comprised by metals such as Au, Ag, Pt, Cu or Pd as the main components. Here, Au is used as the metal comprising the metal nanostructure 30. The metal nanostructure 30 is an Au-rich structure. A carbon compound or other insulator may be mixed into the metal comprising the metal nanostructure 30, and the metal nanostructure 30 may be a M-I-M (metal-insulator-metal) structure.

Submicron or nano-order irregularities are formed on the surface of the metal nanostructure 30. Specifically, the metal nanostructure 30 is a structure in which nano-microparticles of Au are aggregated into clusters or fractals (see FIG. 10 and FIG. 11). The aggregate of Au nano-microparticles in the metal nanostructure 30 includes a plurality of projections projecting in the direction of the thickness of the element 3 or in the direction of lamination (upward). These projections are aggregated into clusters. Otherwise, they assume fractal structures with Au nanoparticle aggregate diffused into multiple branches. The metal nanostructure 30 includes a plurality of first projections 31 and second projections 32. Part of the aforementioned plurality of projections comprises the first projections 31, and the other part comprises the second projections 32.

The metal nanostructure 30 has at least one periodic structure 30. Preferably, the metal nanostructure 30 has multiple, plural or no periodic structures 30. One periodic structure 33 is comprised by multiple adjacent projections 31, 31 . . . from among the aforementioned plurality of projections of the metal nanostructure 30. Pairs of first projections 31, 31 . . . comprising each of the periodic structures 33 are arranged with spaces (periods) along the direction of the surface of the element 3 (a direction perpendicular to the lamination direction). The placement (period) of the first projections 31 differs according to the periodic structure 33. The placement (period) of the first projections 31 in these periodic structures 33 is preferably several tens of nm to several μm, ideally approximately 40 nm to 100 nm. This placement (period) preferably is approximately 0.1 to 1 times the wavelength of the incident light L, ideally approximately 0.1 times. Furthermore, the aforementioned placement (period) preferably is approximately 0.1 to 1 times the sensitive wavelength (visible light to infrared region) of a Schottky element consisting of an n-type semiconductor 10 and conductive layer 40. The metal nanostructure 30 preferably includes at least one periodic structure having placement approximately 0.1 to 1 times the size of a given wavelength within the sensitive range of the aforementioned Schottky element.

Furthermore, multiple second projections 32 are disposed scattered on the metal nanostructure 30. Each of the second projections 32 are disposed so that they overlap with given periodic structures 33. Otherwise, each of the second projections 32 are disposed adjacent to given periodic structures 33. The second projections 32 are larger in their projection height than the first projections 31, with a larger kurtosis (ratio of projection height and base width) than the first projections 31. The projection height of the second projections 32 preferably is approximately 50 nm to 200 nm. The dispersion of the second projections 32 preferably is larger than the wavelength of incident light. For example, the aforementioned dispersion preferably is 1 μm or more, preferably approximately 2 μm to 3 μm. The upper limit of the dispersion of the second projections 32 is preferably 3 μm to 5 μm.

The pair of electrodes 41, 42 are disposed at mutually separate positions in a direction along the surface of the element 3. These electrodes 41, 42 each laminate the surface of the conductive layer 20. As shown in FIG. 2, these electrodes 41, 42 are disposed mutually separate at positions corresponding to different ends of each structural member 2a-3d.

The electrodes 41, 42 are comprised by a metal such as Au, Ag, Pt, Cu or Pd. Here, Au is used as the metal comprising the electrodes 41, 42. Consequently, the electrodes 41, 42 are comprised by the same metal component as the metal component comprising the metal nanostructure 30.

The metal component comprising the metal nanostructure 30 and the metal component comprising the electrodes 41, 42 may be mutually different. The two electrodes 41, 42 may be comprised by mutually different metal components.

As shown in FIG. 3, a barrier layer 50 is provided as an example of a polarity adjustment layer between the first electrode 41 and conductive layer 20. The barrier layer 50 is comprised by an insulator of $SiO_2$, SiN or a carbon compound (plastic, for example). The thickness of the barrier layer 50 is small enough to generate a tunneling effect. For example, the thickness of the barrier layer 50 is on an angstrom-order, namely less than 1 nm. In the drawings, the thickness of the barrier layer 50 exceeds the thickness of the conductive layer 20 or metal nanostructure 30. The first electrode 41 and conductive layer 20 comprise a capacitor in opposition with the barrier layer 50 interposing.

The first electrode 42 is in direct contact with the conductive layer 20. Preferably, the second conductive layer 42 is in ohmic contact with the conductive layer 20.

Next, we will explain the photoelectric conversion element 3 through to the power extraction structure.

As shown in FIG. 2, the power extraction unit 4 includes a negative extraction unit 70 and a positive extraction unit 80. A terminal 71 for the negative extraction unit 70 is connected to the first electrode 41 of each photoelectric conversion element 3. Wiring 72 extends from the terminal 71. The wiring 72 is connected to the negative polarity input terminal 5e of the converter 5. A terminal 81 for the positive extraction unit 80 is connected to the second electrode 42 of each photoelectric conversion element. Wiring 82 extends from the terminal 81. The wiring 82 is connected to the positive polarity input terminal 5a of the converter 5.

In FIG. 2, a positive power extraction structure is disposed on the top side of structural members 2a-2d, and a negative power extraction structure is disposed on the bottom side of structural members 2a-2d. Furthermore, the top-bottom relationship of the power extraction structures may be reversed. Otherwise, the positive power extraction structure is disposed on one side on either the left or right of the structural members 2a-2d, and the negative power extraction structure is disposed on the other side on either the left or right of the structural members 2a-2d.

As shown in FIG. 4 and FIG. 5, if the photoelectric conversion element 3 installation subject is a movable member such as a window member 2c or door 2d, the power extraction units 70, 80 have respective movable contacts 73, 83 and fixed contacts 74, 84.

As shown in FIG. 4, in a sliding window member 2c, for example, a movable contact 73 is provided on the lower edge. The terminal 71 and movable contact 73 are connected via a connecting line 72a. The fixed contact 74 extends along the bottom rail of the window member 2c. The movable contact 73 slidably touches the fixed contact 74. When the window member 2c is moved, the movable contact 73 maintains a connection with the fixed contact 74 while sliding together the window member 2c. The wiring 72b extends from the fixed contact 74 to the converter 5.

The movable contact 73 may be provided on the outer circumferential surface of the rollers 2ca of the window member 2c, and the fixed contact 74 may be comprised by a rail that guides the rollers 2ca.

The movable contact 83 is provided on the top edge of the window member 2c. The terminal 81 and movable contact 83 are connected via wiring 82a. The fixed contact 84 extends along the top rail of the window member 2c. The movable contact 83 slidably touches the fixed contact 84. When the window member 82 is moved, the movable contact 83 maintains a connection with the fixed contact 84 while sliding together the window member 2c.

As shown in FIG. 5, a top and bottom pair of hinges 90U, 90L are provided on the edge of one side of a hinged door 2d (left of FIG. 5). These hinges 90 are the rotational axis of the door 2d. Each hinge 90 has a rotating part fixed to the door 2d and a fixed part 92 fixed to the wall of the house 2.

A movable contact 73 is provided on the rotating part 91 of the bottom hinge 90L. A fixed contact 73 is provided on the fixed part of the hinge 90L. Regardless of whether the door 2d is open or closed, the movable contact 73 rotatably (slidably) touches the fixed contact 74. A terminal 71 is connected to the movable contact 73 via wiring 72a. Wiring 72b extends from the fixed contact 74 to a converter 5.

A movable contact 83 is provided on the rotating part 91 of the top hinge 90U. A fixed contact 83 is provided on the fixed part 92 of the hinge 90U. Regardless if the door 2d is open or closed, the movable contact 83 rotatably (slidably) touches the fixed contact 84. A terminal 81 touches the movable contact 83 via wiring 82a. The wiring 82b extends from the fixed contact 84 to a converter 5.

We will explain the manufacturing and installation procedure for a photovoltaic device 1, focusing on the manufacturing method for a photoelectric conversion element 3.

[Semiconductor Layer Forming Process]

The surface of a base material 6 is coated by CVD (chemical vapor deposition) or PVD (physical vapor deposition).

[Conductive Layer Raw material Coating Process]

Co, which is the raw material component of the conductive layer 20, is film-formed on top of a semiconductor layer 11. Sputtering, deposition or other PVD may be used as the Co film-forming method. Co may be coated by not only PVD but spin-coating or other film-forming methods.

[Barrier Placement Process]

A barrier layer 50 consisting of an insulator (aluminum, for example) of angstrom-order thickness is placed at the position that the first electrode 41 on top of the aforementioned Co film will be disposed. The placement of the barrier layer 50 may be accomplished by CVD and various other film-forming methods.

[Electrode Placement Process]

A metal raw material (Au) that will serve as the first electrode 41 is provided on top of the aforementioned barrier layer 50. In addition, a metal raw material (Au) that will serve as the second electrode 42 is provided at the location that the second electrode 42 on top of the Co film will be disposed. The placement of the metal raw material (Au) used for the electrodes 41, 42 may be accomplished by sputtering, deposition and various other film-forming methods.

[Metal Nanostructure Raw Material Placement Process]

Furthermore, metal raw material (Au) that will serve as the metal nanostructure 30 is placed in an area between the electrodes 41, 42 on top of the aforementioned Co film. The form and characteristics of the aforementioned metal raw material (Au) are not specified, but may be a thin film, small pieces, a small mass, granular, a powder, colloidal, fibers, wife, or dots, otherwise any other form or characteristics are acceptable. If the aforementioned metal raw material (Au) is in the form of a thin film, then it may be film-formed by sputtering, deposition or other PVD, for example. Part of the metal raw material (Au) serving as the aforementioned electrodes 41, 42 may be diffused in the area between the electrodes by diffusing processes described below for a metal nanostructure 30, in which case, the metal nanostructure raw material placement process may be omitted.

[Diffusion Process]

Next, a base material 6 was placed in an annealing tank, and annealing is performed. The annealing temperature conditions preferably are 400° C. to 800° C., and ideally 600° C. Annealing is performed as much as possible under a 100% inactive gas atmosphere. The inactive gases that may be used for annealing are rare gases such as He, Ar and Ne, otherwise $N_2$ may be used. The annealing pressure conditions are close to atmospheric pressure, for example, a low pressure several Pa below atmospheric pressure.

Through the aforementioned annealing, Co is diffused in the Si comprising the surface part of the semiconductor layer 11. Thus, a CoSix conductive layer 20 wherein the surface part of the Si layer 11 has been self-organized is formed, and it is possible to fully Schottky junction the semiconductor layer 11 and conductive layer 20.

Furthermore, through the aforementioned annealing, the Au microparticles disposed on top of the conductive layer 20 are diffused so that a cluster or fractal is formed along the surface of the conductive layer 20. Namely, the Au microparticles are diffused branching into multiple layers, into a fractal structure aggregate. The surface of the aggregate has submicron and non-order irregularities, and assumes a cluster form. Thus, a metal nanostructure 30 may be naturally formed.

The diffusion process may be performed by methods other than annealing.

[Installation Process]

Base material 6, namely structural members 2a-2d, are installed in prescribed locations of the house 2. Then, the electrodes 41, 42 and converter 5 are connected to the power extraction unit 4.

We will explain the operation of the aforementioned photovoltaic device 1.

When light of a wavelength in the visible light to infrared region (specifically a wavelength of approximately 0.4 μm to 2 μm) enters the photoelectric conversion element 3, photocarriers are generated by photoelectric conversion at the Schottky junction with the CoSix layer 20 in the n-Si layer 11. Furthermore, it is possible to raise the sensitivity of the photoelectric conversion with a metal nanostructure 30 in the proximity of the aforementioned Schottky junction. Additionally, it is possible to expand the wavelength region of the photoelectrically convertible light with the metal nanostructure 30.

The photocarrier electrons generated at the aforementioned Schottky junction move to the n-Si layer 11 as a result of the electric field of the depletion layer. Thus, electrons flow from the second electrode 42 to the conductive layer 20. The flow of electrons between the second electrode 42 and conductive layer 20 is smooth. On the other hand, the first electrode 42 comprises a capacitor with the conductive layer 20, with an interposing barrier layer 50. Hence, electrons flow to the first electrode 41 along the conductive layer 20. Electrons accumulate in an area opposing the first electrode 41 on the conductive layer 20. These electrons may pass through the barrier layer 50 through a tunneling effect, and move to the first electrode 41. Thus, it is possible to extract photoinduced current. Consequently, the first electrode 41 acts as a cathode. The second electrode 42 acts as an anode. By doing so, it is possible to designate an anode electrode 42 and a cathode electrode 41, and control the direction of the photoinduced current. Accordingly, it is possible to ensure that current-voltage properties are asymmetrically positive and negative, and achieve ideal diode properties. Electrons accumulate in an area opposing the first electrode 41 on the conductive layer 20, so voltage endurance is raised, and the voltage-current properties during light incidence shifts by degrees to the bias side (front). Thus, it is possible to enlarge the output power.

We will explain the operation of the metal nanostructure 30 in detail. A plasmon is located on the surface of the Au nano-microparticles comprising the metal nanostructure 30. This surface plasmon and incident light resonate, and a large electric field is generated. The periodic structures 33 of the metal nanostructure 30 raise the sensitivity of the photoelectric conversion to incident light of a wavelength corresponding according to the periods thereof (placement of first projections 31). Namely, the periodic structures 33 cause plasmon resonance sensitively attuned to incident light of a wavelength approximately 1 to 10 times the period thereof, particularly 10 times. Since the periods of the first projections differ depending on the periodic structure 33, the metal nanostructure 30 can widen the sensitive wavelength region. At least one of the periodic structures 33 has a placement 0.1 to 1 times the size of a given wavelength within the wavelength range from the visible light to infrared region, so the element 3 overall sensitive range can comprise the entirety of the aforementioned wavelength range. Furthermore, near field light is generated in the periphery of the second projections 32. Through the synergistic effect with plasmon resonance due to this near field light and the aforementioned periodic structure 33, it is possible to generate a large photoinduced electric field. Thus, it is possible to provide a photoelectric conversion element that is photosensitive to a wide band region from the visible light to infrared region. Even if the incident light is faint, it is possible to generate photovoltaic power at high sensitivity. By enlarging the dispersion of the second projections 32 enlarged more than the wavelength of incident light (visible light region to infrared region), preferably 1 μm or more, ideally 2 μm to 3 μm, it is possible to avoid weakening of the electric field from interference by the adjacent second projections 32, 32. By making the upper limit of the dispersion of second projections 32 3 μm to 5 μm, it is possible to maintain a high placement density for the second projections 32, ensure a number of periodic structure 33 that can produce an interaction with the second projections 32, and fully widen the sensitive band region. Accordingly, it is possible to provide a photoelectric conversion element 3 that can handle a wide band region from the visible light to infrared region.

The power generated by the photoelectric conversion element 3 is delivered to the converter 5 via the power extraction unit 4. The converter 5 alternating current converts the electricity, and provides it to electrical appliances in the house 2. Excess power may be sold elsewhere.

The photovoltaic device 1 can be used for the photoelectric conversion of sunlight of a wide band region into power. It is naturally capable of yielding sufficiently large amounts of power during clear skies, but may also do so when skies are cloudy. Furthermore, it is also capable of yielding power after sunset by photoelectrically converting infrared light radiated from surrounding structures. Consequently, it is capable of generating power whether day or night.

It is capable of preventing thermoconversion of infrared light by absorbing infrared light, can reduce the energy entering indoors, and inhibit indoor rises in temperature. In particular, it is capable of generating power while providing a thermal barrier during light collection when the aforementioned photoelectric conversion element 3 has been disposed on window glass. On this point, it is very different from infrared cut glass which can only reflect or absorb light.

Since the photoelectric conversion element 3 is semitransparent, even if installed on window glass, no lighting is lost. The electrodes 41, 42 may be disposed in the corners or periphery of the photoelectric conversion element 3, and while they do not cover the entire surface of the photoelectric conversion element 3, even if the photoelectric conversion element 3 is installed on window glass, it is possible to fully maintain the transparency of the window glass. Furthermore, there is no need to provide wiring for the window glass.

The photoelectric conversion element is very thin and semitransparent, so even if installed on each of the structural members 2a-2d of the house 2, they will hardly affect the appearance of the structural members 2a-2d, and can largely maintain their design prior to installation of the photoelectric conversion element 3.

Since the photoelectric conversion element 3 is lightweight, it hardly affects the strength of structures. Even if the photoelectric conversion element 3 is installed on the roof of a garage, prefab house or other structure relatively weak in strength, it is possible to fully ensure the load resistance of the structures. Even if the photoelectric conversion element 3 is provided on a door 2d or window 2c, it will not obstruct the opening or closing of the door 2d or window 2c.

Next, we will explain other embodiments of the invention. In the embodiment below, elements overlapping with the previous embodiment are indicated in drawings with the same references and explanations omitted.

Figure 6:
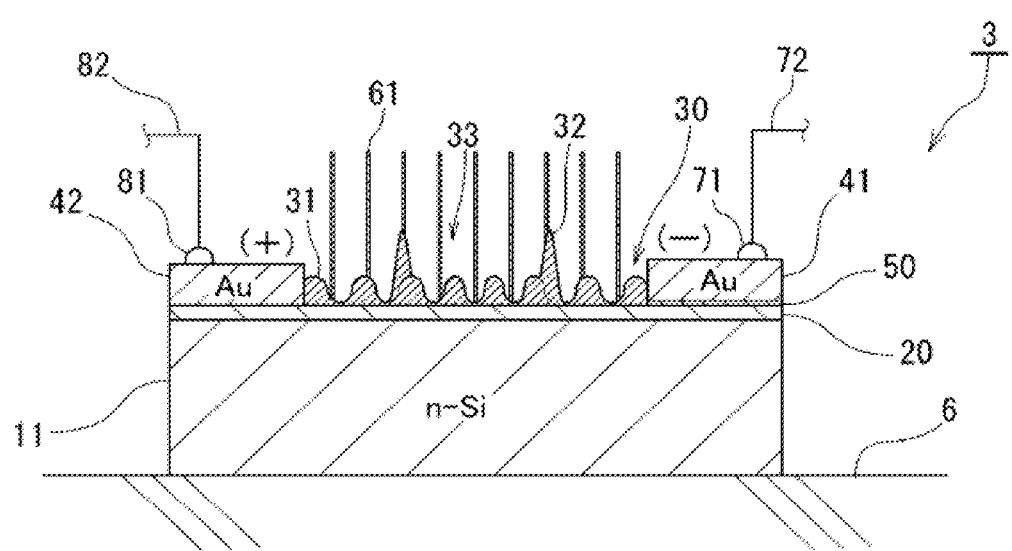
FIG. 6 is a cross section showing the structural outline of a photoelectric conversion element related to a second embodiment of the invention.

The second embodiment shown in FIG. 6 is related to a modified example of the photoelectric conversion element 3. An n-type semiconductor nanostructure 61 has been provided on the surface of the photoelectric conversion element 3 (top of FIG. 6). The n-type semiconductor nanostructure 61 is comprised by zinc oxide nanowire. The zinc oxide is an n-type semiconductor. The nanostructure 61 may be comprised by n-type GaN instead of zinc oxide.

The nanostructure 61 is provided so that it projects from the surface of the photoelectric conversion element. Here, the nanostructure 61 is projecting from a metal nanostructure 30. Furthermore, if the metal nanostructure 30 is coated by only part of the conductive layer 20, then a nanostructure 61 may be projecting from the conductive layer 20 in the part of the metal nanostructure 30 that is not covered. The nanowire can be formed by CVD, PVD, sol-gel or other methods. The nanostructure 61 does not have to be nanowire, and may be a nanoneedle, a nanotube, or nanorod.

It is possible to raise the photoelectric conversion sensitivity to incident light of a relatively short wavelength (ultraviolet to visible light) through a zinc oxide nanostructure 61. Specifically, it is possible to improve sensitivity to light from an ultraviolet light region less than approximately 0.4 μm to a visible light region of about 1 μm. It is possible to raise the quantum efficiency by comprising the nanostructure 61 with nanowire, and additionally ensure that the sensitivity of the photoelectric conversion element 3 is raised.

Figure 7:
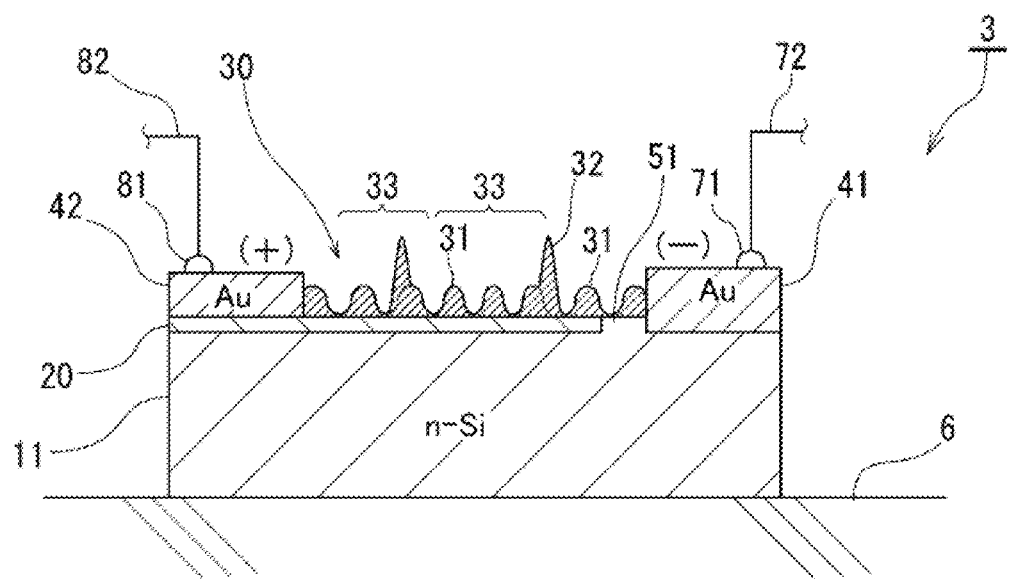
FIG. 7 is a cross section showing the structural outline of a photoelectric conversion element related to a third embodiment of the invention.

The third embodiment shown in FIG. 7 is related to a modified example of the photoelectric conversion element. A projecting layer 51 is provided on the photoelectric conversion element 3 as a polarity adjustment layer instead of the barrier layer 50 described before. The projecting layer 51 is formed integrated with the n-type semiconductor layer 11. A section close to the first electrode 41 on the surface (top surface) of the semiconductor layer 11 is projecting, and this projecting part comprises the projecting layer 51. The projection height of the projecting layer 51 is the same as the thickness of the conductive layer 20, and may be 1 nm to 10 nm, for example, preferably several nm. The width dimensions of the projecting layer 51 (left-right dimensions in FIG. 7) may be from 0 mm to several mm, for example, preferably about 1 mm. In FIG. 7 the projection height of the projecting layer 51 (top-bottom dimensions) exceed the width (left-right dimensions).

One side of the projecting layer 51 (left surface in FIG. 7) is in Schottky contact with the end of the conductive layer 20. The other side of the projecting layer 51 (right side in FIG. 7) and the semiconductor layer 11 are in Schottky contact with the first electrode 41. The metal nanostructure 30 is formed so that it spreads from the conductive layer 20 to the top surface of the projecting layer 51. The metal nanostructure 30 may be provided on only the top surface of the projecting layer 51. Otherwise, the metal nanostructure 30 may be provided on only the top surface of the conductive layer 20.

When light enters the photoelectric conversion element 3, in addition to photocarriers being generated at the Schottky junction of the base of the conductive layer 20 and the semiconductor layer 11, photocarriers are generated at the Schottky junction of the right end of the conductive layer 20 and the projecting layer 51. These carrier electrons flow to the projecting layer 51 and additionally to the first electrode 41 as a result of the depletion layer electric field between the conductive layer 20 and projecting layer 51. Consequently, it is possible to ensure that the first electrode 41 is a cathode. It is also possible to ensure that the second electrode 42 is an anode.

Figure 8:
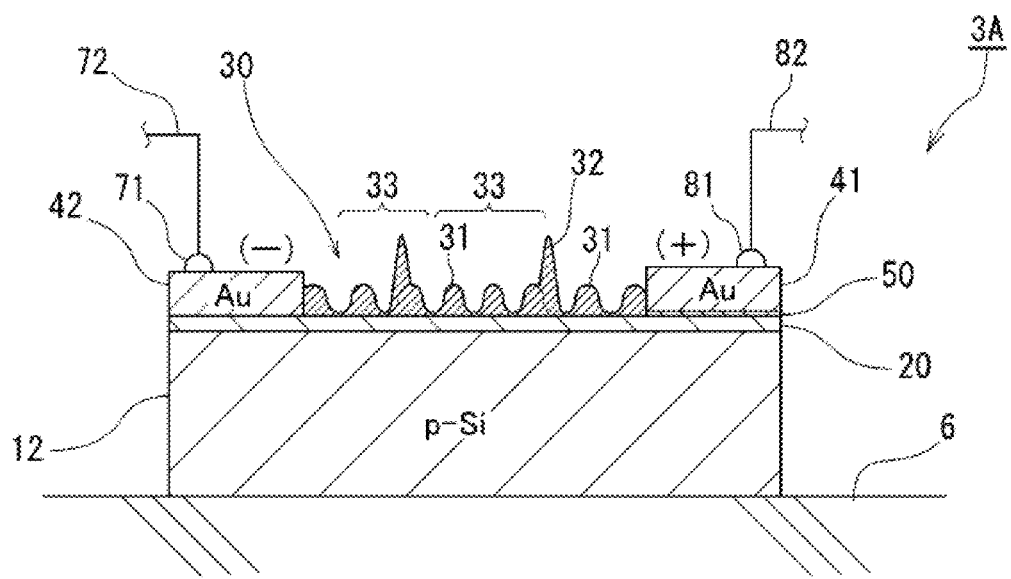
FIG. 8 is a cross section showing the structural outline of a photoelectric conversion element related to a fourth embodiment of the invention.

The fourth embodiment shown in FIG. 8 is related to a modified example of the photoelectric conversion element. This photoelectric conversion element 3A provides a p-type semiconductor layer 12 instead of the n-type semiconductor layer 11 in the first embodiment. The p-type semiconductor layer 12 is comprised by p-type silicon wherein B (boron) and other p-type impurities had been doped, for example.

The placement (period) of the first projections 31 in the periodic structures 33 of the p-type photoelectric conversion element 3A preferably is somewhat larger than that of the n-type photoelectric conversion element 3. For example, the aforementioned placement (period) ideally is approximately 60 nm to 150 nm. The dispersion of second projections 32 in the periodic structures 33 of the p-type element 3A preferably is somewhat larger than that of the n-type element 3. For example, the aforementioned dispersions preferably are approximately 3 μm to 5 μm, with the upper limit preferably 5 μm to 6 μm.

A positive power extraction terminal 81 is connected to the first electrode 41 of the p-type photoelectric conversion element 3A. A negative power extraction terminal 71 is connected to the second electrode 42 of the p-type photoelectric conversion element 3A.

The p-type photoelectric conversion element 3A has a sensitivity to an infrared light region of a wavelength longer than that of the n-type photoelectric conversion element 3 (specifically wavelengths of approximately 1 μm to 4 μm). When light of this sensitivity band enters the photoelectric conversion element 3a, photocarriers are generated from the photoelectric conversion at the Schottky junction with the CoSix layer on the p-Si layer. The positive holes among these photocarriers move to the p-Si layer 12 as a result of the depletion layer electric field. Thus, positive holes flow from the second electrode 42 to the conductive layer 20. Positive holes flow along the conductive layer 20 to the first electrode 41. Positive holes accumulate in an area opposing the first electrode 41 on the conductive layer 20. These positive holes can pass through the barrier layer 50 as a result of a tunneling effect, and can move to the first electrode 41. Thus, it is possible to extract photoinduced current. Consequently, the first electrode 41 acts as an anode. The second electrode acts as a cathode.

The invention is not limited to the aforementioned embodiments, and may be modified as long as the principle of the invention remains unchanged.

For example, the metal component comprising the semiconductor layer 20 does not have to be Co, and may be Fe, W, Ni, Al or Ti.

The metal component comprising the metal nanostructure 30 does not have to be Au, and may be Ag, Pt, Cu or Pd.

The manufacturing process for the photoelectric conversion elements 3, 3A may substitutions or changes made to its procedure as appropriate. For example, the annealing for silicidizing the conductive layer 20 and the annealing for forming the metal nanostructure 30 may be performed separately. In the third embodiment, the annealing for bringing the first electrode 41 into ohmic contact with the semiconductor layer 11, the annealing for silicidizing the conductive layer 20, and the annealing for forming the metal nanostructure 30 may be performed separately.

The photovoltaic device 1 may provide a storage unit for storing electricity generated by the photoelectric conversion elements 3, 3*a*.

The barrier layer 50 does not have to be an insulator, and may be a semiconductor. The barrier layer 50 may be interposed at least in part between the conductive layer 20 and first electrode 41, and does not necessarily need to be interposed entirely between the conductive layer 20 and electrode 41.

The multiple embodiments may be mutually combined. For example, the semiconductor layer in the second embodiment (FIG. 6) may be a p-type semiconductor layer 12 (FIG. 8) instead of an n-type. In which case, the nanostructure 61 preferably uses a carbon, p-GaN or other p-type semiconductor instead of an n-type semiconductor, and ideally uses a carbon nanotube. Thus, it is possible to raise the photoelectric conversion sensitivity to infrared light. Specifically, it is possible to improve the sensitivity to infrared light from about 2 μM to approximately 4 μm in strength.

In the third embodiment (FIG. 7), a p-type semiconductor 12 (FIG. 8) is used instead of an n-type for the semiconductor layer. In which case, positive holes generated between the conductive layer 20 and semiconductor layer 12 flow to the semiconductor layer 12, and as a result, positive holes flow from the second electrode 42 to the conductive layer 20. Additionally, positive holes generated between the conductive layer 20 and projecting layer 51 flow to the projecting layer 51 and additionally the first electrode 51. Consequently, the first electrode 41 acts as an anode, and the second electrode 42 acts as a cathode.

The photovoltaic device 1 may be equipped with both an n-type photoelectric conversion element 3 and a p-type semiconductor element 3A.

Working Example 1

We will explain working examples. However, the invention is not limited to the working examples below.

In Working Example 1, a metal nanostructure was prepared and observed. The metal nanostructure was prepared as follows.

A film was formed over the entire surface of a largely square n-type Si substrate by sputtering. The thickness of the Co film was 8 nm.

Next, after organic washing for five minutes, mask printing was performed to film-form a thick Au film at the four corners and middle of the surface of the Co film by sputtering. The thickness of the Au film was approximately 10 nm.

Next, annealing was performed. The atmospheric gas used for annealing was He 100%. The annealing temperature was 600° C. The annealing time was three minutes.

Through annealing, Co was diffused over a surface section of the n-type Si substrate and CoSix was formed.

Figure 9:
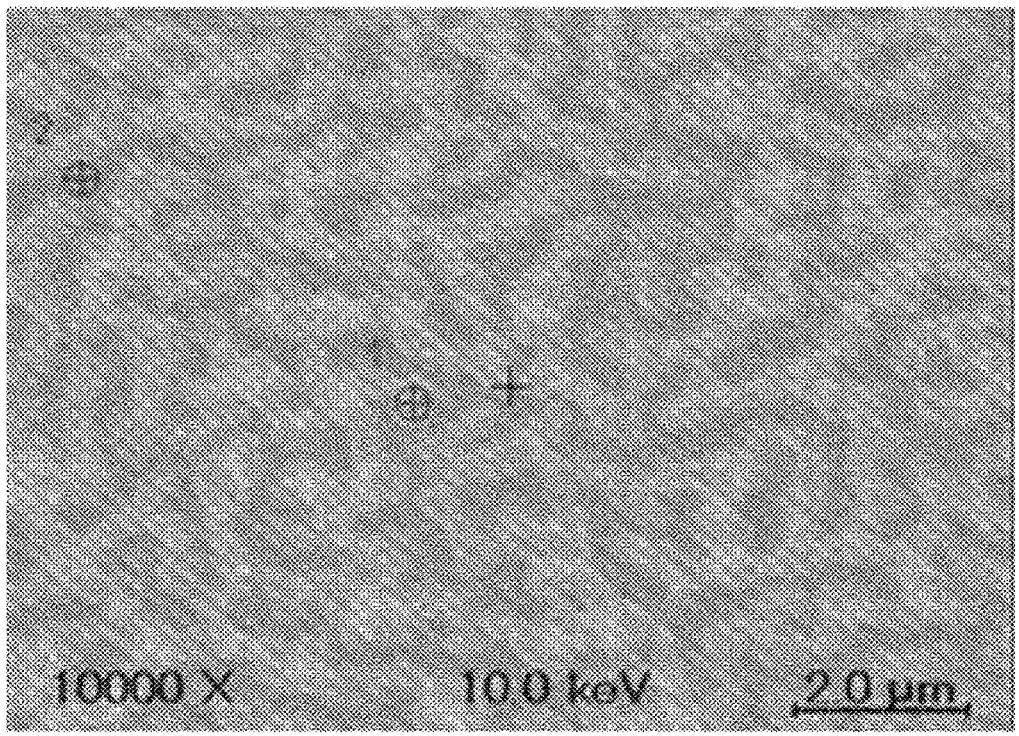
FIG. 9 (a) is an image from observing part of the surface of a metal nanostructure in the first working example with an SEM (scanning electron microscope).
Figure 9:
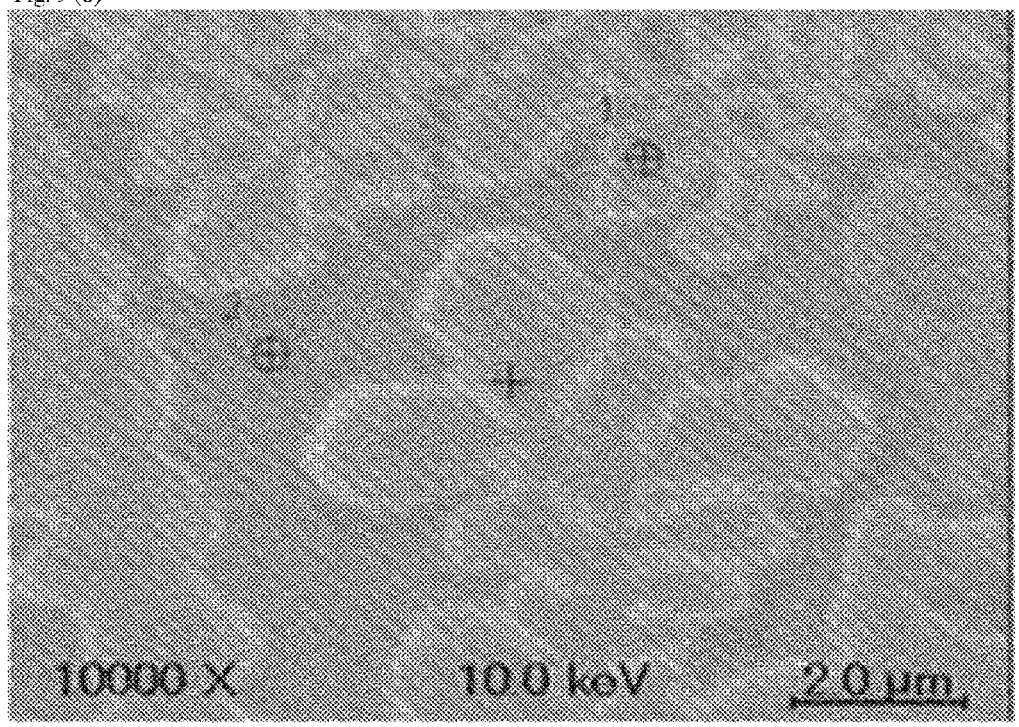

Two locations near the aforementioned Au film were observed by SEM (scanning electron microscope). FIG. 9 (*a*) and (*b*) show the scanning images. They confirmed that Au film microparticles had been diffused along the surface of the CoSix film, and that a metal nanostructure had been naturally formed in the periphery of the Au film. The form of the metal nanostructure differed depending on the location. As shown in the image in (b), fractal structures were formed depending on the location in the metal nanostructure.

Laser light (wavelength 635 nm) was projected at several points of the aforementioned metal nanostructure, and the surface structure of the points with maximum photoinduced incurrent at zero bias was stereoscopically observed with an AFM (atomic force microscope).

Figure 10:
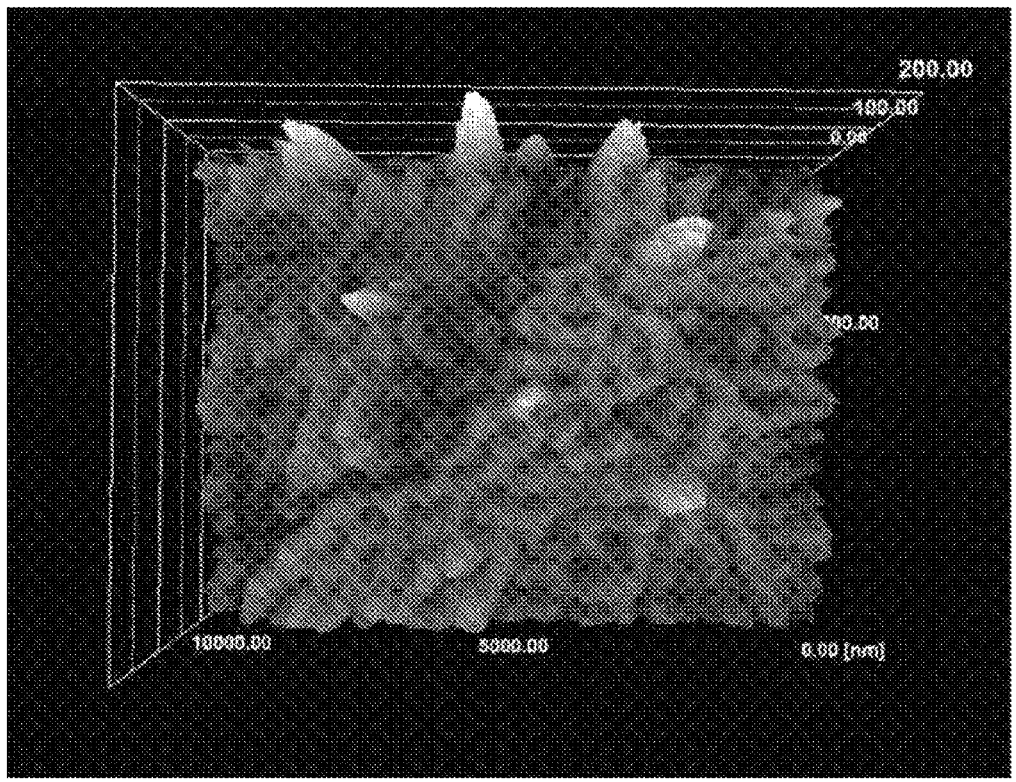
FIG. 10 is a stereoscopic image from observing the surface structure of the metal nanostructure in the first working example with an AFM (atomic force microscope).
Figure 11:
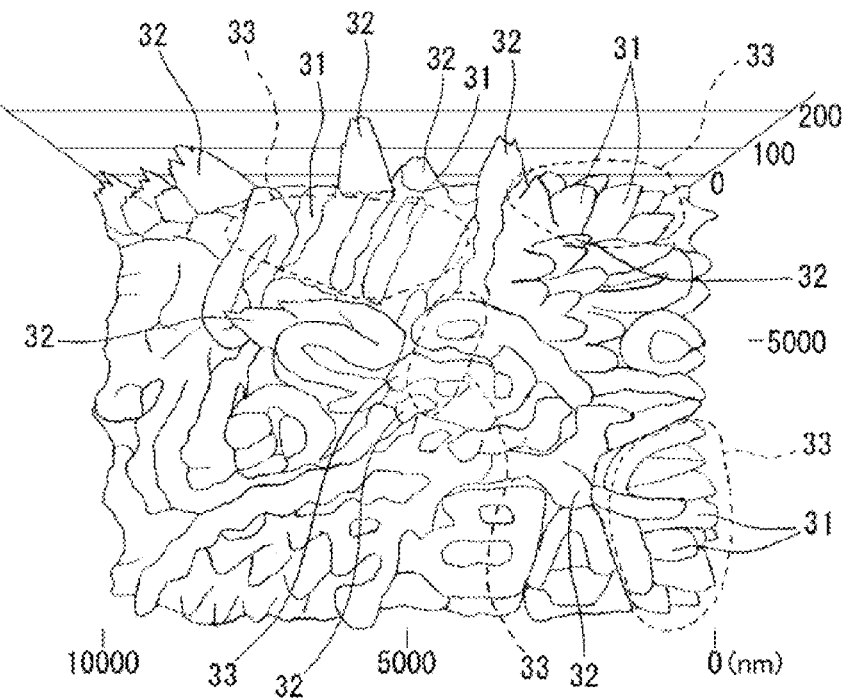
FIG. 11 is an explanatory drawing of the stereoscopic image in FIG. 10.

FIG. 10 is an image thereof. FIG. 11 is a reproduction of the image in FIG. 10 for explanation.

Submicron or nano-order irregularities are formed on the surface of the metal nanostructure, and cluster structures or fractal structures were confirmed. Furthermore, in the aforementioned irregular forms, a plurality of periodic structures 33 and a plurality of second projections 32 were confirmed. Each periodic structure 33 included multiple first projections 31, and these first projections 31 were arrayed in random periods (placement) corresponding to the periodic structures 33. The period of the periodic structures 33 was about 100 nm or less. The projection height of each of the first projections 31 was about 10 nm to 20 nm Each of the second projections 32 were disposed overlapping with given periodic structures 33, or disposed near the periodic structures 33. The projection height of the second projections 32 was larger than the projection height from the first projections 31, which was approximately 50 nm to 200 nm. The dispersion of second projections was about 2 μM to 3 μM.

INDUSTRIAL APPLICABILITY

The invention is applicable to solar cells, for example.

EXPLANATION OF REFERENCES

1 Photovoltaic device
2 House (structure)
2*a* Roof member (structural member)
2*b* Outer wall member (structural member)
2*c* Window member (structural member, movable member)
2*d* Door (structural member, movable member)
3, 3*a* Photoelectric conversion element
4 Power extraction unit
5 Converter
5*a* Positive polarity input terminal
5*e* Negative polarity input terminal
6 Base material
11 n-type semiconductor
12 p-type semiconductor
20 Conductive layer 30 Metal nanostructure
31 First projections
32 Second projections
33 Periodic structures
41 First electrode
42 Second electrode
50 Barrier layer (polarity adjustment layer)
51 Projection layer (polarity adjustment layer)
61 ZnO nanowire (semiconductor nanostructure)
70 Negative extraction unit
71 Negative terminal
72 Negative wiring
73 Movable contact
74 Fixed contact
80 Positive extraction unit
81 Positive terminal
82 Positive wiring
83 Movable contact
84 Fixed contact
90 Hinge
91 Rotating part
92 Fixed part

The invention claimed is:

1. A photovoltaic device character by being a device for generating power by absorbing light, characterized by being equipped with
a photoelectric conversion element provided in structural members facing outdoors,
and a power extraction unit for extracting power generated by the aforementioned photoelectric conversion element,
wherein the aforementioned photoelectric conversion element comprises a semiconductor layer, a conductive layer laminated over the aforementioned semiconductor layer, a metal nanostructure having a plurality of periodic structures laminated over the aforementioned conductive layer or aforementioned semiconductor layer and being formed of a different material than the conductive layer, and a plurality of first projections including a pair of first and second electrodes wherein the aforementioned periodic structures are projecting in the direction of the aforementioned lamination, wherein the placement of the aforementioned first projections differ according to the aforementioned periodic structures, the aforementioned first and second electrodes are provided mutually separated in a direction along the surface of the aforementioned photoelectric conversion element,
and the aforementioned power extraction unit includes a pair of terminals respectively connected to the aforementioned first and second electrode.

2. A photovoltaic device as described in claim 1 characterized by at least one of the aforementioned periodic structures having a placement of a size 0.1 to 1 times a given wavelength within a given wavelength range from the visible light to infrared region.

3. A photovoltaic device as described in claim 1 characterized by the aforementioned metal nanostructure further including multiple second projections projecting more than the aforementioned first projections, wherein these second projections are mutually diffused, and each of the second projections are disposed overlapping or adjacent to any of the aforementioned periodic structures.

4. A photovoltaic device as described in claim 1 characterized by being further equipped with a polarity adjustment layer interposed between the aforementioned first electrode and aforementioned conductive layer, to adjust the polarity of the aforementioned first and second electrodes.

5. A photovoltaic device as described in claim 4 characterized by the aforementioned polarity adjustment layer being comprised by an insulator less than 1 nm in thickness.

6. A photovoltaic device as described in claim 4 characterized by the aforementioned polarity adjustment layer being a projecting layer providing projecting on the surface of the aforementioned semiconductor layer, the aforementioned conductive layer being in contact with one side surface of the aforementioned projecting layer, and the aforementioned first electrode being provided on the side opposite the aforementioned conductive layer interposing the aforementioned projecting layer on the aforementioned surface, and making contact with the side surface of the aforementioned opposite side of the aforementioned projecting layer.

7. A photovoltaic device as described in claim 1 characterized by further providing a nanostructure consisting of a semiconductor having sensitivity to the ultraviolet or infrared regions on the surface of the aforementioned photoelectric conversion element.

8. A photovoltaic device as described in claim 7 characterized by the aforementioned nanostructure being a nanowire, nanotube, nanoneedle or nanorod.

9. A photovoltaic device as described claim 1 characterized by the aforementioned structural member being a movable member movably supported on a fixed part,
and the aforementioned power extraction unit including a fixed terminal provided on the aforementioned fixed part, and a movable terminal provided on the aforementioned movable member in slidable contact with the aforementioned fixed terminal.

* * * * *